May 20, 1958 — B. B. KING — 2,835,796

TELEVISION TUNER WITH LOCAL OSCILLATOR VARIABLY COUPLED TO MIXER THROUGH TUNABLE LONG LINES

Filed Feb. 9, 1954 — 2 Sheets-Sheet 1

Inventor
Bernard B. King

By Hill, Sherman, Meroni, Gross & Simpson Attys

May 20, 1958 B. B. KING 2,835,796

TELEVISION TUNER WITH LOCAL OSCILLATOR VARIABLY COUPLED TO MIXER THROUGH TUNABLE LONG LINES

Filed Feb. 9, 1954 2 Sheets-Sheet 2

Inventor
Bernard B. King

By Hill, Sherman, Meroni, Gross & Simpson Attys

United States Patent Office 2,835,796

Patented May 20, 1958

2,835,796

TELEVISION TUNER WITH LOCAL OSCILLATOR VARIABLY COUPLED TO MIXER THROUGH TUNABLE LONG LINES

Bernard B. King, Indianapolis, Ind.

Application February 9, 1954, Serial No. 409,227

1 Claim. (Cl. 250—20)

This invention relates to a television tuner and more particularly to a television tuner operating on the superheterodyne principle and arranged for "beating" a signal of any one of a number of high signal frequencies with a signal from an oscillatior to generate a signal at a fixed lower frequency generally referred to as the intermediate frequency or "I. F." The signal may be amplified at such intermediate frequency or may be converted to a still lower frequency for amplification.

The inveniton finds particular application, at present, in the recently established U. H. F. television band from 470 to 890 megacycles, but it will be apparent that the principles of the invention are not limited to tuners operating in that range and the principles have wide application in the radio and television field.

In its preferred form, the tuner of this invention embodies first and second variable length transmission line sections one of which may be tuned to the signal frequency and coupled to a non-linear impedance device generally referred to as a mixer or first detector, the other being arranged for tuning an oscillator. Means are provided for gang tuning of the two transmission line sections with the difference between the frequencies of tuning of the two sections being maintained equal to the fixed lower frequency or intermediate frequency. With a signal at the signal frequency and a signal at the oscillator frequency applied to the non-linear impedance device, a signal will be produced at the intermediate frequency and such signal will have modulation components corresponding to the received signal, according to well known superheterodyne theory.

According to one feature of this invention, the two variable length transmission line sections are used as a means for coupling signals from the oscillator to the non-linear impedance device or mixer. According to this feature, the two transmission line sections are so related in space that the stray capacitance therebetween couples at least a material portion of the oscillator signal to the mixer. Most preferably, the capacitance may be sufficient to constitute the sole coupling means between the oscillator and the mixer.

According to a specific aspect of this feature, the capacitance between the two transmission line sections is increased as the frequency of tuning is decreased by virtue of the change in length of the sections. Since capacitive reactance is inversely proportional to frequency, this creates a tendency to maintain constant intensity of the oscillator signal coupled to the mixer which, of course, is highly desirable.

According to another feature of the invention, one of the transmission line sections comprises a pair of conductors disposed in generally parallel relation in a common plane and the other variable length transmission line section also comprises a pair of conductors which are disposed in generally parallel relation and which are in the same plane as the conductors of the first section. First and second shorting means are provided for coupling adjacent points of each of the two pairs of conductors together, and means are provided for effecting conjoint movement of such shorting means so as to simultaneously vary the effective lengths of the transmission line sections. By this feature, the construction of the tuner is simplified and the attainment of the requisite coupling between the two transmission line sections is readily obtained.

According to a specific feature, the conductors may be disposed against a generally planar face of a member of insulating material, which may most preferably be accomplished by a printed circuit technique.

According to another feature of the invention, the two pairs of conductors forming the two transmission line sections are not only disposed in a common plane, but extend arcuately about a common axis, and the shorting means for both transmission line sections are carried by a member rotatable about such axis, thus simplifying the simultaneous tuning of the two sections.

The pair of conductors forming one of the transmission line sections may, if desired, be spaced radially from the pair of conductors forming the other transmission line section. Preferably, however, the conductors forming one of the sections are angularly spaced relative to the conductors forming the other of the sections and the tuner may be of minimum radial dimension. Also, the transmission line sections may be symmetrical about the axis and, further, it is possible to obtain more readily the optimum capacitive coupling between sections.

A still further advantage of this arrangement is that the tuner may be mechanically balanced, preferably with the shorting means for the two sections disposed in diametrically opposite positions.

According to still another feature of the invention, the conductors forming the two transmission line sections may have varying width or area, or the spacing therebetween may vary, or both in a manner such that a linear relationship is obtained between the frequency of tuning and movement of the shorting means.

According to a still further feature of the invention, the conductors forming the two transmission line sections may be supported on one face of a sheet of insulating material. This sheet of insulating material may form a partition for a casing and, according to a specific aspect of this feature, the input, oscillator and mixer circuits of the tuner are disposed within the casing on the side of the partition opposite that on which the conductors are mounted. Thus it is possible to mount all of the component parts of the tuner compactly within the casing which is preferably of conductive material to form a shield preventing external signals from affecting the operation of the tuner, and also preventing undesired radiations from the tuner.

It will be apparent that the above described features, and particularly the symmetrical disposiiton of the two pairs of conductors in a common plane and in arcuate relation about a common axis, make possible an extremely compact tuner of very small axial extent and of minimum radial extent. According to a further important feature of this invention, this compact size of the tuner is utilized to advantage in mounting the same in a television receiver.

According to this feature, the tuner is arranged to be mounted behind the front panel of a receiver cabinet and in front of the front wall of the receiver chassis. The tuner journals a sleeve which is arranged to receive a tuning shaft projecting forwardly from the receiver chassis through the front panel of the cabinet, this shaft being arranged for actuating tuning means in the chassis for one high frequency band, such as the V. H. F. television band. The sleeve carries means for adjusting the frequency of tuning of the tuner as it is rotated, which may be the shorting means for the two transmission line sections, as above described. The sleeve may either be affixed to the shaft and rotated therewith, or it may project through the front panel of the receiver cabinet for actuation by a knob separate from but coaxial with the knob utilized to rotate the shaft. It will be noted that this feature makes it possible to readily convert receivers designed for operation in the V. H. F. television band for operation in the U. H. F. television band as well.

An object of this invention, accordingly, is to provide an improved tuner which is very efficient and reliable in operation, which may be readily manufactured at minimum cost and which is extremely compact.

A further object of this invention is to provide a tuner which may be readily mounted in a television receiver.

This invention contemplates other objects, features and advantages which will become more fully apparent from the following detailed description taken in conjunction with the accompanying drawings which illustrate preferred embodiments and in which.

Figure 1:
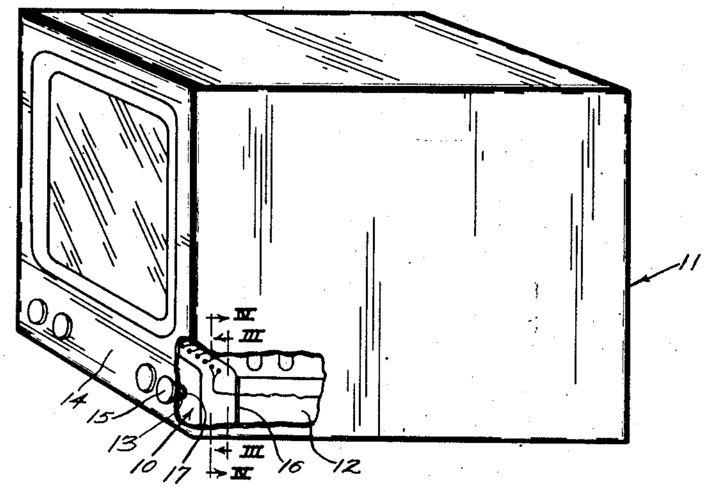
Figure 1 is a perspective view of a television receiver with a high frequency tuner mounted therein, the tuner being constructed and mounted according to the principles of the present invention.

Reference numeral 10 generally designates a high frequency tuner which may be mounted in a television receiver 11, according to the principles of the present invention.

The receiver 11 may be a conventional V. H. F. television receiver having a chassis 12 which may enclose tuning means for the V. H. F. television band from 54 to 216 megacycles, which tuning means may be controlled by a shaft 13 projecting through the front panel 14 of the receiver cabinet and having a knob 15 secured thereto.

The tuner 10 may be used to convert the receiver 11 for the U. H. F. television band from 470 to 890 megacycles. It will be noted that the tuner 10 is very compact and may be mounted between a front wall 16 of the chassis 12 and the front panel 14 of the receiver cabinet, with the shaft 13 projecting therethrough. The tuner 10 has a hollow shaft or sleeve 17 which receives the shaft 13 and which carries means arranged for varying the frequency of tuning of the tuner 10 as it is rotated.

The sleeve 17 may be keyed to the shaft 13 for rotation therewith or it may project through the panel 14 to be actuated by a knob coaxial with the knob 15. Also, in some receivers there is provided a fine tuning control sleeve in coaxial surrounding relation to the main tuning control shaft and in such a case, the sleeve 17 of the tuner 10 may receive such a fine tuning control sleeve and be keyed thereto.

It will be apparent, therefore, that the tuner 10 may be readily incorporated in the receiver 11 of conventional design. It will be apparent, however, that the various principles of this invention are not limited to a tuner for converting a V. H. F. receiver for use in the U. H. F. band but such principles have wide application.

Figure 2:
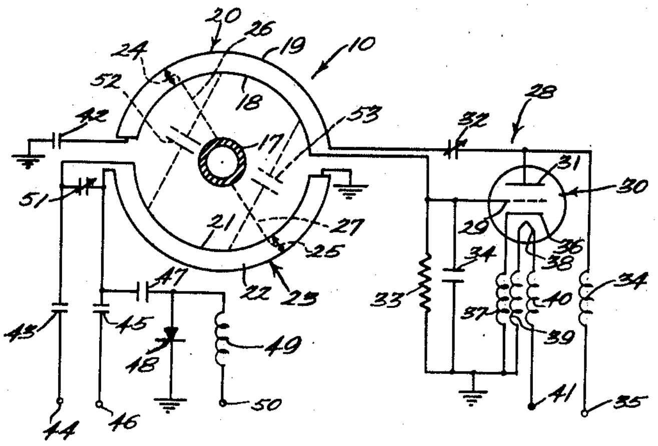
Figure 2 is a schematic diagram of the circuit of the tuner of Figure 1.

Figure 2 is a schematic diagram of one preferred circuit arrangement for the tuner 10. Referring thereto, the tuner 10 may comprise a first pair of conductors 18 and 19 extending arcuately about the axis of the sleeve or hollow shaft 17 in generally parallel relation to define a first transmission line section generally designated by reference numeral 20, and a second pair of conductors 21 and 22 also extending arcuately about the axis of sleeve 17 in generally parallel relation to define a second transmission line section generally designated by reference numeral 23. The transmission line sections 20 and 23 are of variable effective length and for this purpose, first shorting means 24 and second shorting means 25 are respectively arranged for coupling adjacent points of the first pair of conductors 18 and 19 and for coupling adjacent points of the second pair of conductors 21 and 22. The shorting means 24 and 25 are mechanically coupled to the sleeve 17 as indicated by dotted lines 26 and 27 so that as the sleeve is rotated the respective positions of the shorting means 24 and 25 will be varied relative to the transmission line sections 20 and 23 as the sleeve 17 is rotated. It will be understood that although this particular form and arrangement of the variable length transmission line sections is a particularly advantageous feature of the present invention, the sections could take other forms and other features of the invention are not limited thereto. For example, the conductors 18, 19, 21 and 22 might be straight, rather than arcuate, with the shorting means 24 and 25 movable rectilinearly.

One end of the variable length transmission line section 20 (the right-hand end in Figure 2) is arranged for connection to oscillator circuit means generally designated by reference numeral 28 to control the frequency of oscillations thereof. For this purpose, the right-hand end of the conductor 18 is connected through a control grid 29 of a triode vacuum tube 30 which has a plate 31 connected through a variable trimmer capacitor 32 to the right-hand end of the conductor 19. The grid 29 is also connected through a grid-leak resistor 33 and capacitor 34 to ground while the plate 31 is connected through an R. F. choke 34 to a terminal 35 arranged to be connected to a source of relatively high positive potential relative to ground. The tube 30 has a cathode 36 connected through an R. F. choke 37 to ground, the cathode 36 being indirectly heated by a heater 38 which may have one terminal connected through an R. F. choke 39 to ground, the other terminal being connected through an R. F. choke 40 to a terminal 41 which may be connected to one terminal of a source of heater voltage, the other terminal of such source being connected to ground.

It will be appreciated by those skilled in the art that the oscillator circuit 28 is of the "grounded grid" type and that the frequency of oscillations of such circuit will be controlled by the effective length of the variable length transmission line section 20, the effective length of such line being, of course, controlled by the position of the shorting means 24 relative to the right-hand end of the section with the frequency being increased as the shorting means 24 is moved toward the right-hand end of the section.

To prevent spurious oscillations, the left-hand ends of the conductors 18 and 19 may be connected together and through a capacitor 42 to ground.

The variable length transmission line section 23 is arranged for connection to input circuit means and for connection to a non-linear impedance device or mixer. The left-hand end of the conductor 21 is connected through a capacitor 43 to a terminal 44 and the left-hand end of the conductor 22 is connected through a capacitor 45 to a terminal 46, the terminals 44 and 46 being arranged for connection to an antenna or any other desired signal source. The conductor 22 of the variable length transmission line section 23 is also connected through a capacitor 47 to one terminal of a germanium crystal 48, the other terminal of which is connected to ground. The crystal 48, of course, is a non-linear impedance device which functions as a mixer. The junction between the capacitor 47 and the crystal 48 is connected through an R. F. choke 49 to an output terminal 50.

In operation, the shaft 17 is rotated to move the shorting means 25 to a position such that the input circuit is resonated at a desired signal frequency. Simultaneously, the oscillator circuit 28 is tuned by virtue of the position of shorting means 24 to a frequency which is either greater than or less than the frequency of tuning of the input circuit by a fixed frequency generally referred to as the "intermediate frequency," or I. F. The oscillator signal and the input signal are applied to the crystal 48, a signal at such intermediate frequency will be developed thereacross which intermediate frequency signal will have modulation components corresponding to those of the input signal. This intermediate frequency signal is applied through the R. F. choke 49 to the terminal 50. The terminal 50 may be connected to an intermediate frequency amplifier in the receiver 11 or may be connected to the input of the V. H. F. tuning means of the receiver 11 with such tuning means being tuned to the frequency of the signal developed at the terminal 50.

To adjust tracking between the oscillator circuit and the input circuit so as to maintain a fixed frequency difference therebetween, a trimmer capacitor 51 is connected between the left-hand ends of the conductors 21 and 22 forming the transmission line section 23, and this capacitor 51 together with the trimmer capacitor 32 in the plate circuit of the oscillator may be adjusted.

According to a specific feature of the present invention, the inherent capacitance between the variable length transmission line sections 20 and 23 is utilized to couple currents at the oscillator frequency to the input circuit and mixer. This capacitance is indicated diagrammatically in Figure 2 by capacitors 52 and 53 shown in dotted lines. This inherent capacitance has been found sufficient to provide optimum coupling and hence the necessity for a separate capacitor is obviated, although this capacitance could be used in conjunction with a separate capacitor if desired.

It will be noted in Figure 2 that the inherent capacitance between the transmission line sections 20 and 23 as indicated by dotted line capacitors 52 and 53 will be increased as the shaft 17 together with the shorting means 24 and 25 are moved counterclockwise to decrease the frequency and such capacitance will be decreased as the shaft 17 is rotated clockwise to increase the frequency. Since capacitive reactance is inversely proportional to frequency, this tends to maintain a constant reactance and a constant intensity of the oscillator signal coupled to the input circuit which, of course, is highly desirable.

Figures 3, 4, 5:
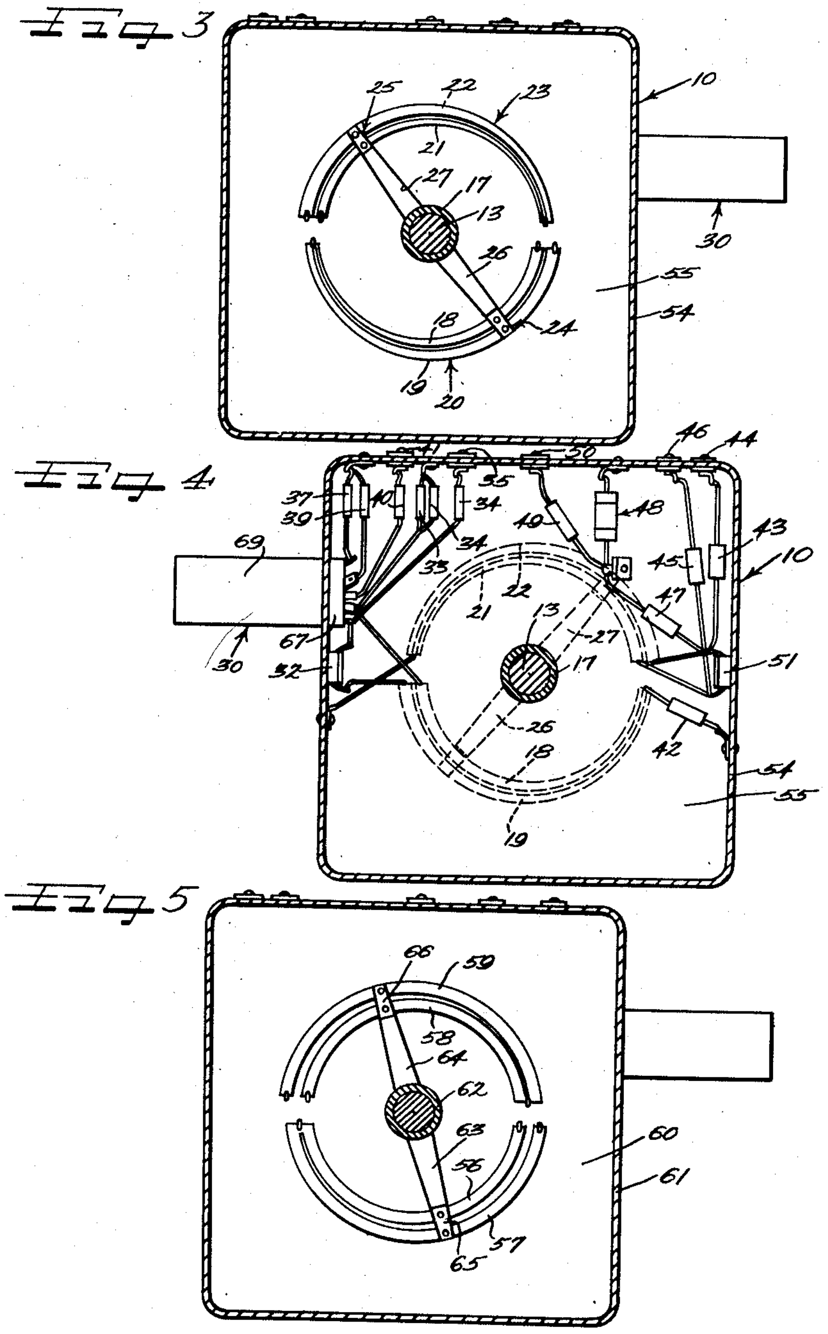
Figure 3 is a sectional view through the tuner of Figure 1, taken substantially along line III—III.
Figure 4 is another sectional view taken substantially along line IV—IV of Figure 1.
Figure 5 is a sectional view similar to that of Figure 3 but illustrating a modified construction.

Figures 3 and 4 illustrate one preferred physical construction of the tuner 10. In these figures, the same reference numerals are employed as used in the schematic diagram of Figure 2. All parts of the tuner 10 are preferably enclosed within a generally rectangular casing 54 preferably of a conductive material such as metal so as to provide a shield preventing undesired external signals from affecting the tuner and preventing, insofar as possible, radiations from the tuner, particularly at the oscillator frequency. A sheet 55 of insulating material may be disposed in the casing 54 to form an intermediate partition in a plane generally normal to the axis of the shaft 17.

According to a specific feature of the invention, the conductors 18, 19, 21 and 22 forming the transmission line sections 20 and 23 are all disposed in the same plane and are preferably secured against one face of the partition 55. A printed circuit technique is used to advantage to form the conductors 18, 19, 21 and 22 thus permitting very economical mass production of the tuner.

The mechanical means 26 and 27 for coupling the shorting means 24 and 25 to the shaft or sleeve 17 may take the physical form of a pair of arms projecting in diametrically opposite directions from the axis of the shaft 17 with the shorting means 24 and 25 being defined by the terminal ends of such arms, the arms being of a conductive material preferably of a spring metal to insure effective short circuiting of the conductors. It will be noted that this provides a mechanically balanced construction.

If the conductors 18, 19, 21 and 22 are of uniform cross-sectional area and uniformly spaced, the frequency of tuning will not be a linear function of the angular displacement of the shaft 17 and the rate of frequency change relative to angular movement of the shaft 17 will increase as the tuning is changed toward the high frequency end of the range. According to a specific feature of the invention, either the cross-sectional area of the conductors, or the spacing of the conductors, may be increased as the distance from the high frequency end of the transmission line sections is decreased to obtain a more linear relation between angular displacement of the shaft 17 and frequency of tuning. As shown in Figure 3, the conductors 18, 19, 21 and 22 are of gradually changing width so that the areas thereof will gradually change. As one alternative, the width might be maintained constant, but the thickness varied. A third alternative is illustrated by another preferred embodiment illustrated in Figure 5 in which conductors 56, 57, 58 and 59, which correspond respectively with conductors 18, 19, 21 and 22 in the embodiment of Figures 2–4, are of uniform width and thickness but in which the spacing between the conductors is gradually changed. The conductors 56–59 are mounted on a partition 60 corresponding to the partition 55, the partition 60 being disposed within a casing 61 corresponding to the casing 54. A shaft 62 corresponding to the shaft 17 carries arms 63 and 64 respectively corresponding with the arms 26 and 27 which arms 63 and 64 have terminal end portions 65 and 66 providing short-circuiting means for the pair of conductors 56 and 57 and the pair of conductors 58 and 59, respectively. It may be noted that the embodiment illustrated in Figure 5 has one advantage over the other embodiment in that the conductors 56–59 present a uniformly large area for engagement with the short-circuiting portion 65 and 66. Except for the difference in form of the transmission line sections, the embodiment of tuner illustrated in Figure 5 may otherwise be constructed similarly to that of Figures 2–4.

As shown in Figure 4, the oscillator, input and mixer circuit means may be disposed within the casing 54 on the side of the partition 55 opposite that on which the transmission line sections 20 and 23 are disposed. A tube socket 67 may be mounted in one side of the casing 54 so that the oscillator tube 30 may be plugged into that side of the casing, a shield 68 being preferably disposed around the oscillator tube. The terminals 35, 41, 24, 46 and 50 may be mounted in the upper side of the casing 54 so that suitable connections may be made from the same to antenna, power supply and I. F. amplifier. Trimmer capacitors 32 and 51 may be mounted in opposite sides of the casing as indicated. The oscillator, input and mixer circuit means may be connected by suitable wiring which will be apparent from Figure 4 and connection to the transmission line sections 20 and 23 may be effected through leads extending through the partition 55 of insulating sheet material. It will, of course, be apparent that various changes and modifications might be made in this wiring. If desired, at least some of the circuit components may be formed by printed circuit techniques and at least some could be formed directly on the side of the partition 55 opposite that on which the conductors 18, 19, 21 and 22 are disposed.

It will be understood, also, that various other modifications and variations may be effected without departing from the spirit and scope of the novel concepts of the present invention.

I claim as my invention:

In a high frequency tuner, a first transmission line section comprising a first pair of conductors extending arcuately in general parallel relation about a common axis, a second transmission line section comprising a second pair of conductors extending arcuately in generally parallel relation about said axis, a signal input and mixer circuit coupled to one end of said first transmission line section, an oscillator circuit coupled to one end of said second transmission line section, said transmission line sections being disposed generally on opposite sides of said axis and being located generally in the same plane to serve as a means coupling said circuits together, and a pair of shorting means engaged with said pairs of conductors and conjointly rotatable about said axis to simultaneously change the effective lengths of said transmission line sections and maintain a fixed difference in the frequencies of tuning of said sections, the coupling between said sections being automatically varied by the variations in the effective lengths of said transmission line sections to maintain a substantially constant intensity of the oscillator current applied to said input and mixer circuit.

References Cited in the file of this patent

UNITED STATES PATENTS

| | | |
|---|---|---|
| 1,825,303 | Boddie | Sept. 29, 1931 |
| 2,552,816 | Root | May 15, 1951 |
| 2,591,982 | Van Weel | Apr. 8, 1952 |
| 2,627,579 | Wasmansdorff | Feb. 3, 1953 |
| 2,653,228 | Pan | Sept. 22, 1953 |
| 2,700,730 | Prew | Jan. 25, 1955 |
| 2,759,098 | White et al. | Aug. 14, 1956 |
| 2,759,158 | Puerner et al. | Aug. 14, 1956 |
| 2,772,355 | Deutsch et al. | Nov. 27, 1956 |
| 2,773,988 | Thias et al. | Dec. 11, 1956 |